(12) United States Patent
Hanagandi et al.

(10) Patent No.: US 10,950,325 B2
(45) Date of Patent: Mar. 16, 2021

(54) MEMORY BUILT-IN SELF TEST ERROR CORRECTING CODE (MBIST ECC) FOR LOW VOLTAGE MEMORIES

(71) Applicant: Marvell Asia Pte, Ltd., Singapore (SG)

(72) Inventors: Deepak I. Hanagandi, Bangalore (IN); Igor Arsovski, Williston, VT (US); Michael A. Ziegerhofer, Jeffersonville, VT (US); Valerie H. Chickanosky, South Burlington, VT (US); Kalpesh R. Lodha, Shahapur (IN)

(73) Assignee: Marvell Asia Pte., Ltd., Singapore (SG)

( * ) Notice: Subject to any disclaimer, the term of this patent is extended or adjusted under 35 U.S.C. 154(b) by 17 days.

(21) Appl. No.: 16/375,115

(22) Filed: Apr. 4, 2019

(65) Prior Publication Data

US 2020/0321070 A1 Oct. 8, 2020

(51) Int. Cl.
*G11C 29/42* (2006.01)
*G11C 29/12* (2006.01)
(Continued)

(52) U.S. Cl.
CPC .......... *G11C 29/42* (2013.01); *G11C 29/1201* (2013.01); *G06F 3/064* (2013.01); *G06F 3/0619* (2013.01); *G06F 11/08* (2013.01); *G06F 11/1004* (2013.01); *G06F 11/106* (2013.01); *G06F 11/1008* (2013.01); *G06F 11/1028* (2013.01); *G06F 11/1072* (2013.01); *G06F 11/1629* (2013.01); *G06F 2211/109* (2013.01); *G11C 8/08* (2013.01); *G11C 29/44* (2013.01); *G11C 29/4401* (2013.01); *G11C 29/52* (2013.01); *G11C 2029/1202* (2013.01); *H03M 13/19* (2013.01)

(58) Field of Classification Search
CPC .. G06F 11/1008; G06F 11/1072; G06F 3/064; G06F 11/1004; G06F 11/1028; G06F 11/106; G06F 11/1629; G06F 3/0619; G06F 11/08; G06F 2211/109; G11C 29/52; G11C 29/42; G11C 29/44; G11C 29/4401; G11C 8/08; G11C 2029/1202; G11C 29/1201; H03M 13/19
See application file for complete search history.

(56) References Cited

U.S. PATENT DOCUMENTS 5,923,599 A 7/1999 Hii et al.
7,308,621 B2 12/2007 Adams et al.
(Continued)

FOREIGN PATENT DOCUMENTS

DE 102016103867 9/2016

OTHER PUBLICATIONS

Shabana P.B.et al.,"An Integrated ECC and BISR Scheme for Error Correction in Memory",International Research Journal of Engineering and Technology (IRJET), vol. 02, Issue: 09, Dec. 2015, 7 pages.
(Continued)

*Primary Examiner* — April Y Blair
*Assistant Examiner* — Sazzad Hossain (57) ABSTRACT

The present disclosure relates to a structure including a memory built-in self test (MBIST) circuit which is configured to repair a multi-cell failure for a plurality of patterns in a single wordline of a sliding window of a memory.

16 Claims, 5 Drawing Sheets

(51) Int. Cl.
*G06F 11/08* (2006.01)
*G11C 8/08* (2006.01)
*G06F 11/10* (2006.01)
*H03M 13/19* (2006.01)
*G06F 3/06* (2006.01)
*G11C 29/52* (2006.01)
*G11C 29/44* (2006.01)
*G06F 11/16* (2006.01)

(56) References Cited

U.S. PATENT DOCUMENTS

| | | | | |
|---|---|---|---|---|
| 9,519,442 | B2* | 12/2016 | Mnich | G06F 3/0619 |
| 2007/0291561 | A1* | 12/2007 | Braceras | G11C 7/12 |
| | | | | 365/201 |
| 2011/0113280 | A1* | 5/2011 | Chickanosky | G11C 29/4401 |
| | | | | 714/6.12 |
| 2014/0223096 | A1* | 8/2014 | Zhe Yang | G06F 3/0619 |
| | | | | 711/114 |
| 2014/0317469 | A1* | 10/2014 | Sohn | G06F 11/1052 |
| | | | | 714/764 |
| 2019/0236001 | A1* | 8/2019 | Patel | G06F 3/0608 |

OTHER PUBLICATIONS

Chin-Lung Su et al., "An Integrated ECC and Redundancy Repair Scheme for Memory Reliability Enhancement", IEEE International Symposium on Defect and Fault Tolerance in VLSI Systems (DFT'05), 2005, 9 pages.

Nicolaidis et al., "Transparent BIST for ECC-Based Memory Repair", Grenoble, France, IEEE, 2013, 8 pages.

* cited by examiner

MEMORY BUILT-IN SELF TEST ERROR CORRECTING CODE (MBIST ECC) FOR LOW VOLTAGE MEMORIES

FIELD OF THE INVENTION

The present disclosure relates to a memory built-in self test error correcting code (MBIST ECC), and more particularly, to a circuit and a method for a MBIST ECC for low voltage memories which improves yield and reduces area and test time.

BACKGROUND

Memory built-in self test (MBIST) is an important tool for testing memories (including finding/diagnosing and repairing defects within those memories). As more memory is integrated into chips, thorough BIST test and repair is a requirement in order to ensure reasonable product quality/reliability levels. To improve MIBST quality, more test patterns are run as part of a manufacturing test. Total test time can take many millions of cycles when all necessary test patterns are included.

During the manufacturing test, memory is tested using a single BIST engine. BIST engines may run into two different modes of operations: repair mode and pass-fail mode. Repair mode repairs the plurality of memory by swapping the failed locations with redundant elements and the redundancy solution gets enabled at the end of the repair mode. Pass-fail mode qualifies the plurality of memory after the redundancies are enabled.

In order to reduce the power of memory, the operating voltage may be reduced; however, the number of failures gradually increases with further reductions in operation voltage to a point where the failures cannot be fixed using available redundancies. For example, error correcting coding (ECC) has played an important role to fix single cell/multi-cell failures at a customer location; however, ECC is used after a manufacturing test in which the memory is validated. There is no known method which leaves single cell failures across multiple patterns during a manufacturing test unrepaired so that the single cell failures can be fixed by the ECC on a customer path and which repairs multi-cell failures across a wordline.

SUMMARY

In an aspect of the disclosure, a structure includes a memory built-in self test (MBIST) circuit which is configured to repair a multi-cell failure for a plurality of patterns in a single wordline of a sliding window of a memory.

In another aspect of the disclosure, a circuit includes a memory, a built-in self test input-output interface (BIO), a built-in self test (BIST) engine which is configured to interface with the BIO to run a plurality of patterns in a sliding window of the memory for a low voltage corner repair mode, and a scratchpad module which is configured to store all failures for the plurality of patterns of the sliding window in a plurality of scratchpad registers.

In another aspect of the disclosure, a method includes programming a sliding window for a memory, running a memory built-in self test (MBIST) for a plurality of patterns in the sliding window for the memory during a low voltage corner repair mode, storing all cell failures for the plurality of patterns in the sliding window for the memory in a plurality of scratchpad registers, determining whether an incoming cell failure of the cell failures is a single cell failure for a single wordline or a multi-cell failure for the single wordline by comparing a row of the incoming cell failure with a row of previously stored cell failures in the plurality of scratchpad registers, repairing the multi-cell failure by using redundant rows and columns in response to determining that the incoming cell failure is the multi-cell failure, and dynamically reducing a size of the sliding window in response to the plurality of scratchpad registers being full.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a memory built-in self test error correcting code (MBIST ECC), and more particularly, to a circuit and a method for a MBIST ECC for low voltage memories which improves yield and reduces area and test time. In more specific embodiments, the present disclosure includes a MBIST to validate memories at a low voltage corner and leaves single cell failures unrepaired to be fixed by the ECC on the customer path and fix/repair multi-cell failures which are seen across a single wordline for multiple patterns. In particular, by implementing the circuit described herein, single cell failures at low voltage corners can be stored in a scratchpad structure (i.e., the scratchpad structure can store multiple row/column failure locations) and a decision can be made (i.e., either fix by ECC or fix by a repair module) by comparing the stored failing locations in the scratchpad module with a current failure to determine whether the failure is a multi-cell failure. In this scenario, a full pattern suite is run on a bank by bank basis to ensure that the scratchpad module does not run out of space during testing.

In conventional systems, a failure can be seen on a specific row (i.e., row 23) and a specific column (i.e., column 45) for a checkerboard pattern. Further, in the conventional systems, a failure can be seen on the same specific row (i.e., row 23) and another column (i.e., column 21) for a blanket pattern. Therefore, both single failures are on a single wordline. However, if both of these single failures get activated (i.e., becomes a multi-cell failure on a single wordline) during a read operation, the error correcting code (ECC) cannot fix this type of failure. Therefore, conventional systems cannot fix multi-cell failures on a single wordline due to multiple patterns being run. Thus, in conventional systems, the data being written would be different from data being read back on that wordline. In contrast, the present disclosure utilizes a scratchpad structure to store failure locations temporarily until all of the patterns are run for a given window. If the scratchpad structure determines that there is a multi-cell failure on a single wordline, the scratchpad can instruct a repair module of a MBIST structure to repair the multi-cell failure. Further, in the present disclosure, memories can use an existing MBIST architecture with a low operating voltage which can reduce power usage by approximately 30% (compared to known systems).

Figure 1:
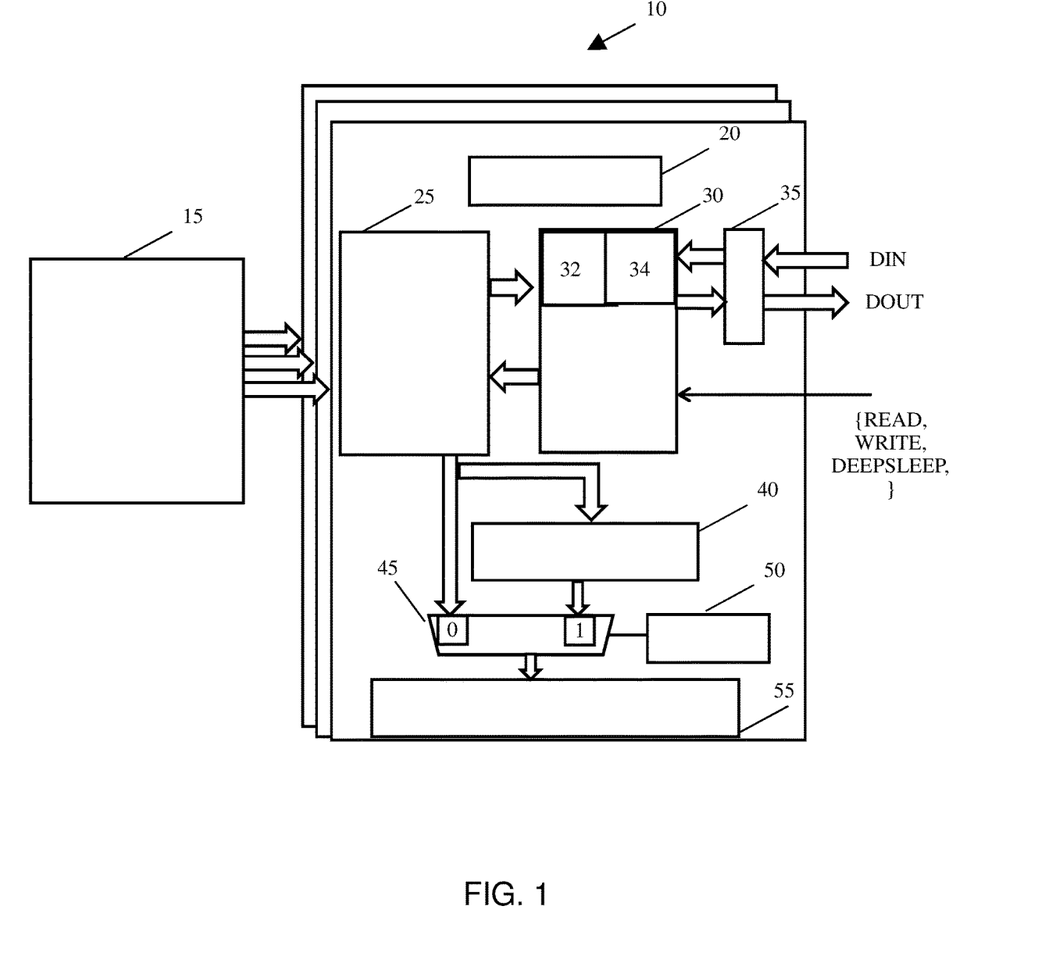
FIG. 1 shows an overview of a MBIST structure with a scratchpad structure in accordance with aspects of the present disclosure.

FIG. 1 shows an overview of a MBIST structure with a scratchpad structure in accordance with aspects of the present disclosure. In embodiments of the present disclosure, a MBIST structure 10 includes a built-in self test (BIST) engine 15. Further, a single BIST engine (e.g., BIST engine 15) can drive multiple memory wrappers (e.g., a memory wrapper 20) and each of the multiple memory wrappers can have a built in self test input output interface (BIO) (e.g., BIO 25). Further, the MBIST structure 10 includes a memory 30 which includes test inputs 32 and functional inputs 34, an error correcting code (ECC) device 35, and a scratchpad module 40. The MBIST structure also includes a multiplexer 45, a low voltage mode device 50, and a repair module 55.

In embodiments, the BIST engine 15 provides inputs to the BIO 25. The BIO 25 receives and outputs signals to the memory 30. The memory 30 receives and outputs signals to the ECC device 35 and receives read, write, and deepsleep signals. The ECC device 35 receives a data input DIN and outputs a data output DOUT. The scratchpad module 40 receives an output from the BIO 25. The multiplexer 45 receives inputs from the scratchpad module 40, the BIO 25, and the low voltage mode device 50. The repair module 55 receives an output from the scratchpad module 40.

In operation, the MBIST structure 10 runs in a repair mode for all patterns of all voltage corners (with the exception of low voltage corners). In the repair mode, the MBIST structure 10 will fix all of the failures. The MBIST structure 10 is also run in a low voltage corner repair mode. If there is a single cell failure when all patterns are run for a given sliding window (e.g., memory bank), a single cell failure can be left unrepaired because the ECC can repair the single cell failure on the customer path. However, if there are multiple cell failures on a single wordline, then the multiple cell failures can be repaired by the repair module 55 in the MBIST structure 10 by replacing the failed memory cells with available redundant rows.

In the low voltage corner repair mode (i.e., the low voltage mode device 50 inputs a "1" to the multiplexer 45), the MBIST structure 10 will run all patterns for a given bank. When running all of the patterns for the given bank, each failure is stored in the scratchpad module 40. In particular, for each failure, the scratchpad module 40 will store a failing column address, a failing row address, a redundant row bit to distinguish a fail in a normal space and a redundant space and a redundant column bit for fails in redundant columns and a valid bit in a scratchpad register if there is valid data stored in the scratchpad register. Further, information from each incoming failure is compared to the previously stored failures in the scratchpad module 40. If a cell row of the incoming failure matches a cell row of one of the previously stored failures in the scratchpad module 40, then the scratchpad module 40 determines that there is a multi-cell failure in a single wordline and the multi-cell failure is a must-fix wordline row. The information of the must-fix wordline row is then communicated to the repair module 55 which will fix the multi-cell failure in a single wordline using available redundancies (i.e., redundant rows and columns). If the cell row of the incoming failure does not match a cell row of one of the previously stored failures in the scratchpad module 40, information of the incoming failure is stored in another scratchpad register of the scratchpad module 40 and fixed by the ECC device 35, assuming that no cell row of future failures matches the cell row of the failure stored in the another scratchpad register.

If the scratchpad module 40 runs out of space, incoming failure information for incoming failures is sent to the repair module 55 to repair the incoming failures. Alternatively, when the scratchpad module 40 runs out of space, the scratchpad module 40 can send a signal (e.g., scratchpad full signal or scratchpad overflow signal) back to the BIST engine 15 to lower down the sliding window granularity based on a sliding window control register setting. Further, once a full set of patterns are run for a specific sliding window (e.g., a specific memory bank), the scratchpad registers of the scratchpad module 40 are cleared, and the process is repeated to collect all of the failures for the next sliding window, e.g., next memory bank. The number of ECC blocks depends on the number of segments present in the memory. If the ECC is capable of handling 1 fail, then 2 fails seen in the same segment are to be repaired by the available row redundancy. Moreover, if the ECC is capable of handling 2 fails, then if 3 fails are seen on the given wordline for a given segment, the wordline will be repaired by the available row redundancy.

During a manufacturing test of embedded memories, MBIST is run at different corners in the MBIST structure 10 and the failures are repaired using available redundancies for all of the given operating conditions of the embedded memories. For low voltage applications, if the voltage VCS of the embedded memories is reduced beyond operating limits, the number of failures gradually increases when the operating voltage is decreased. ECC can be employed on the customer path to correct failures at low voltages. Prior to using the ECC on the customer path, the MBIST needs to qualify the memories at low voltages. If there are single cell failures during the MBIST runs (i.e., when all patterns are run for a given memory bank), the corresponding cell failure can be left unrepaired and can be fixed by the ECC on the customer path. However, if there are multi-cell failures on a wordline, then the multi-cell failures will be replaced with available redundant rows (i.e., the multi-cell failures cannot be repaired by ECC).

Figure 2:
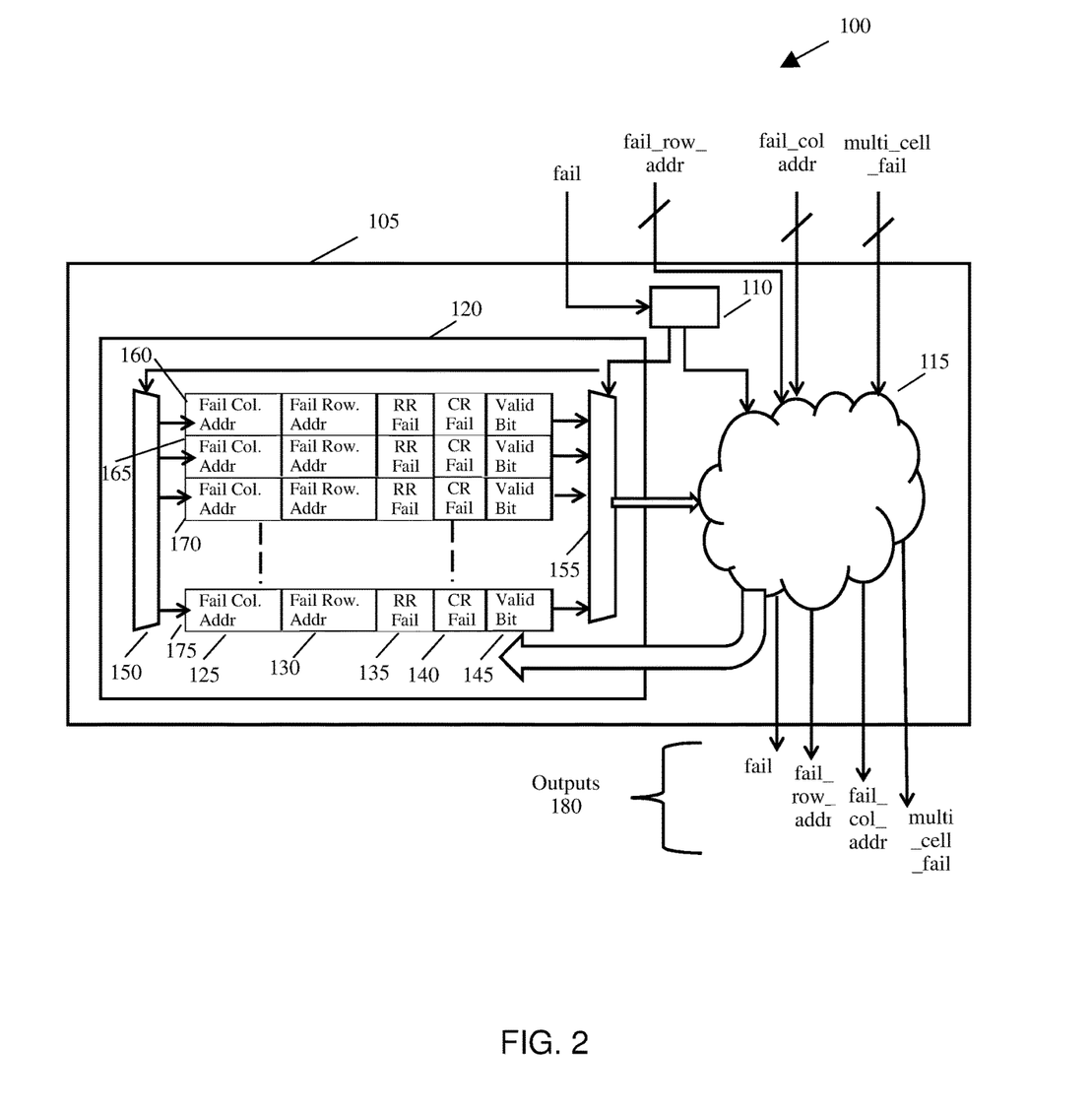
FIG. 2 shows the scratchpad structure in accordance with aspects of the present disclosure.

FIG. 2 shows the scratchpad structure in accordance with aspects of the present disclosure. In embodiments of the present disclosure, the scratchpad structure 100 includes a scratchpad module 105, a finite state machine 110, a comparative structure 115, and a set of scratchpad registers 120. The set of scratchpad registers 120 includes a set of failure column addresses 125, a set of failure row addresses 130, a set of failures in redundant row spaces 135, a set of failures in redundant column spaces 140, and a set of valid bits 145. The scratchpad structure module 105 also includes multiplexers 150, 155, scratchpad registers 160, 165, 170, and a set of output signals 180. In embodiments of the present disclosure, the number of scratchpad registers 120 can go up to an nth value, in which n is an integer value greater than zero, e.g., an nth scratchpad register 175.

In operation, the scratchpad structure 100 logs all of the information (e.g., failing cell row and column information) for all of the failures when the MBIST structure 10 runs in the low voltage corner repair mode. In particular, the scratchpad register 120 will store all of the information of the failures of a single sliding window (e.g., memory bank) in corresponding registers (e.g., scratchpad registers 160, 165, 170, ..., and an nth scratchpad register 175) with the aid of the finite state machine (FSM) 110 to change the corresponding scratchpad register that receives the failure information through the multiplexer 150.

As shown in FIG. 2, the finite state machine (FSM) 110 receives a fail signal and the comparative structure 115 receives the failed row address fail_row_addr, the failed column address fail_col_addr, and multi-cell failure multi_cell_fail. The comparative structure 115 is a logic gate which compares the incoming single cell failure with the failures that have been previously stored in the scratchpad registers 120 (e.g., scratchpad registers 160, 165, 170, ..., and 175) with the aid of the finite state machine (FSM) 110 to change the register that is passed through the multiplexer 155.

In particular, the comparative structure 115 will compare a row of the incoming single cell failure with the rows of the failures that have been previously stored in the scratchpad registers 120. If the row of the incoming single cell failure matches a row of the failures that have been previously stored in the scratchpad registers 120, the scratchpad structure 100 will output the output signals 180 (i.e., the fail signal, the failed row address fail_row_addr, the failed column address fail_col_addr, and the multi-cell failure multi_cell_fail) to indicate that there is a multi-cell fail for a single wordline with this information. The repair module 55 can repair the multi-cell failure for a single wordline using available redundancies (i.e., redundant rows and columns).

In the situation of low voltage MBIST, the repair module 55 takes the fail information from the scratchpad module 105 and repairs the failure corresponding with the fail information. Each of the scratchpad registers 120 stores single cell failing information such as a failing row address, failing column address, failure in a redundant row space, failure in a redundant column space. Each incoming fail information is compared to the information stored in the scratchpad registers 120. If the incoming failing cell row matches the rows stored in the scratchpad registers 120, then the row is a must-fix row and the information is communicated to the repair module 55. If the scratchpad registers 120 run out of space, then incoming failure information is sent to a failure address and repair register (FARR) to repair the fails using available redundant rows/redundant columns. Once the full set of patterns is run for a given memory bank, the scratchpad registers 120 are cleared and the next set of patterns is run for a next memory bank.

Accordingly, as the ECC cannot repair a multi-cell failure in a single wordline, the repair module 55 can repair/fix the multi-cell failure with available redundant elements (i.e., redundant rows and columns or redundant wordlines). However, if the row of the incoming single cell failure does not match a row of the failure that have been previously stored in the scratchpad registers 120, no repair is performed at this point and the ECC device 35 will repair the incoming single cell failure at a later time in the customer path (assuming that no cell row of future failures matches the cell row of the incoming single cell failure).

In the scratchpad registers 120, the scratchpad of each segments can be stacked vertically and an additional bit can be added to store the failing segment information. Stacking failing segments can allow the scratchpad resources to be used generically across all segments such that more fails in a given segment can be balanced out with less fails in other failing segments. Also, stacking failing segments helps to decrease a test time as a scratchpad full signal can be based on an entire scratchpad instead of being based on a single segment being full.

The comparative structure 115 will also check if the scratchpad registers 120 are full (i.e., if there is no more space available to store incoming cell failures). If the comparative structure 115 determines that the scratchpad registers 120 are full, information from incoming cell failures can be sent to the repair module 55 to repair the incoming cell failures with available redundancies (i.e., redundant rows and columns). Alternatively, when the scratchpad registers 120 are full, the scratchpad structure 100 (e.g., the comparative structure 115) can send a signal (e.g., scratchpad full signal or scratchpad overflow signal) back to the BIST engine 15 to lower down the sliding window granularity based on a sliding window control register setting.

In an example of the present disclosure, a size of the sliding window can be automatically/dynamically reduced in half by the BIST engine 15. In particular, the BIST engine 15 can reduce a default sliding window range by half (i.e., cut the size of the default sliding window range in half) by a right shift operation of a sliding window control register when the scratchpad is full. In this way, the scratchpad registers 120 will store half of the incoming cell failure information.

In another example, the size of the sliding window can be dynamically reduced by a specified preprogrammed amount by the BIST engine 15. In other words, the BIST engine 15 can program a size of the sliding window. Also, the scratchpad registers 120 can be reset to zero at the end of a sliding window by a logic gate (e.g., address check structure). The MBIST 10 can then resume testing for the reduced sliding window to avoid an overflow or full state of the scratchpad registers 120. The reduced sliding window can also be further reduced in case the scratchpad registers 120 get full again.

The scratchpad module 105 can also be parameterized. For example, the parameter can be a function of a number of wordlines in a specific memory bank. In a typical SRAM memory with eight banks, two segments, and scratchpad registers 120 having a depth of eight locations, the SRAM memory can handle a maximum of 8×8×2 (=128) single cell failures without using any of the available redundancies. Therefore, these 128 single cell failures can be handled by the ECC device 35.

The scratchpad structure 100 can manage failures during a MBIST and the failures can be stored in a failure register in a failure address and repair register (FARR)/repair mode for a low voltage corner. Further, the scratchpad structure 100 can make a decision on using available redundancy elements (i.e., redundant rows and columns) or reducing a sliding window in a situation when there is a scratchpad overflow. The scratchpad structure 100 can also keep collecting failures on a sliding window-by-window basis for a pass fail mode. Further, if the number of fails on a given wordline cannot be corrected by ECC, the scratchpad structure can output a fail signal back to the BIST system (i.e., MBIST structure 10) indicating that there is unfixable memory.

Figure 3:
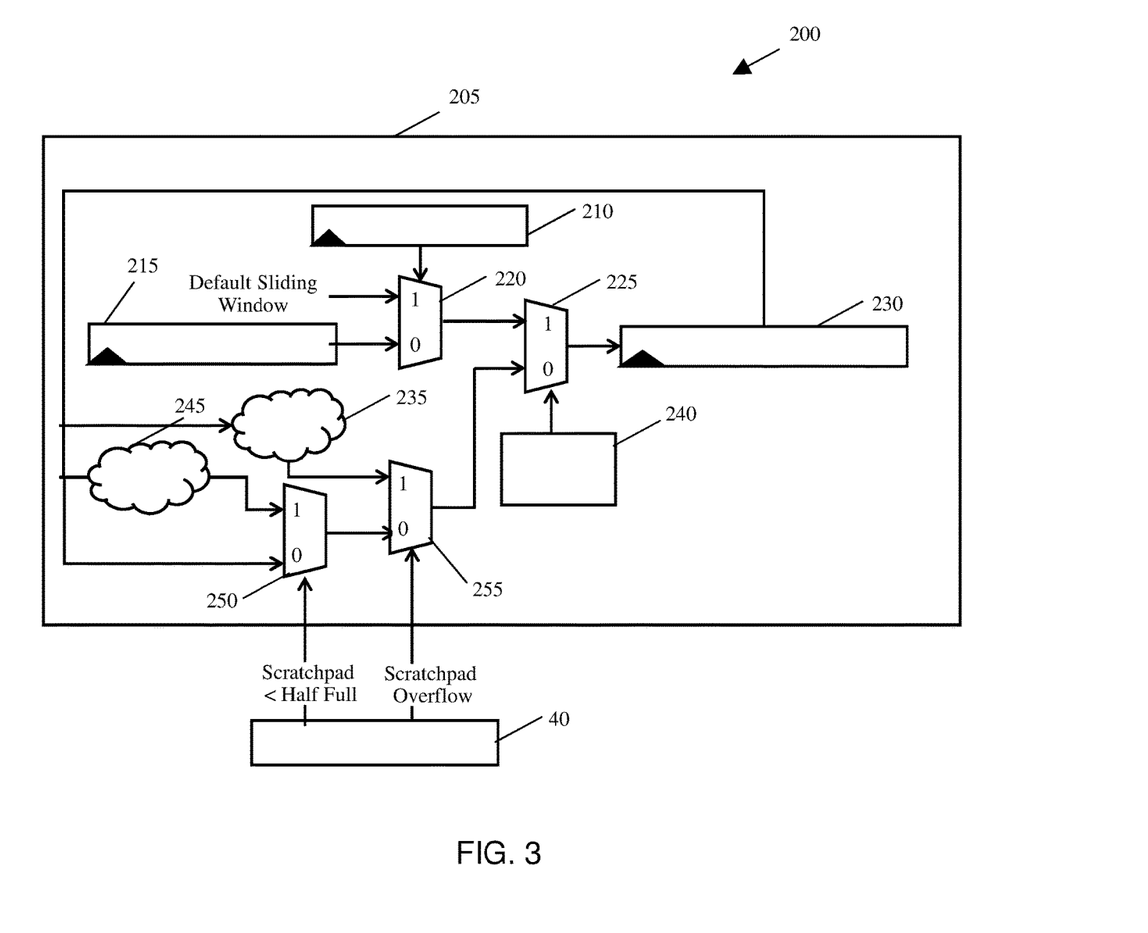
FIG. 3 shows a MBIST sliding window structure in accordance with aspects of the present disclosure.

FIG. 3 shows a MBIST sliding window structure in accordance with aspects of the present disclosure. In embodiments of the present disclosure, a MBIST sliding window structure 200 of the BIST engine 15 includes a sliding window structure 205. The sliding window structure 205 includes a program switch 210, a program sliding window count 215, and multiplexers 220, 225, 250, and 255. The sliding window structure 205 also includes a final sliding window count 230, a divisor structure 235, a multiplexer input 240, and a multiplier structure 245. As shown in FIG. 3, the scratchpad module 40 is outside of the sliding window structure 205.

In the operation of embodiments shown in FIG. 3, a size of a default sliding window (i.e., a size of minimum value of the sliding window) is equal to a number of scratchpad registers 120 (i.e., size of the scratchpad registers 120). In other embodiments, the sliding window can start with the minimum default value or a programmed value. Further, a programmable control register can choose between the two options of the minimum default value or the programmed value. The programmable control register can be programmed by a user such that the sliding window can overlap or add 2/4/8 wordline programmable addresses during testing so as to get better coverage for cell faults which are neighbor sensitive.

In embodiments, the multiplexer 220 takes in the default sliding window and the output of the program sliding window count 215 as inputs. The multiplexer 220 will output either the default sliding window or the output from the program sliding window count 215 based on a value of the output of the program switch 210. In other words, the output of the program switch 210 will determine the output of the multiplexer 220.

The output of the multiplexer 220 is input to the multiplexer 225. The multiplexer 225 also takes in an input from the output of the multiplexer 255. The output of the multiplexer 225 is based on the output of the multiplexer input 240. The output of the multiplexer 225 is sent to the final sliding window count register 230. The output of the final sliding window count register 230 is then looped back to the divisor structure 235 and the multiplier structure 245.

In the structure shown in FIG. 3, the scratchpad module 40 sends a scratchpad overflow signal to the multiplexer 255 which indicates that the scratchpad module 40 overflows (i.e., the scratchpad registers 120 are in a full state). When the multiplexer 255 receives the scratchpad overflow signal from the scratchpad module 40, the multiplexer 255 will output the input signal from the divisor structure 235. The divisor structure 235 will receive the output of the final sliding window count register 230 and divide the output of the final sliding window count register 230 by 2 and send the divided value to the multiplexer 255. As stated above, the output of the multiplexer 255 is sent to the multiplexer 225. In this way, the divisor structure 235 can reduce the size of the output of the final sliding window count register 230 by half.

In embodiments, the scratchpad module 40 sends a scratchpad less than half full signal which indicates that the scratchpad module 40 is less than half full (i.e., the scratchpad registers 120 are less than a half full state) to the multiplexer 250. When the multiplexer 250 receives the scratchpad "less than" half full signal from the scratchpad module 40, the multiplexer 250 will output the input signal from the multiplier structure 245. The multiplier structure 245 will receive the output of the final sliding window count register 230 and multiply the output of the final sliding window count register 230 by 2 and send the multiplied value to the multiplexer 250. The output of the multiplexer 250 is sent to the multiplexer 255.

In embodiments of the present disclosure, the size of the sliding window can be increased for testing during the next sliding window if there are less fails than the number of scratchpad registers 120 or if the scratchpad registers 120 are less than half full. The size of the sliding window can be continually increased until the scratchpad module 40 overflows (i.e., the scratchpad registers 120 are in a full state). Once the scratchpad module 40 overflows, the size of the sliding window size can be halved (divided by 2) and the sliding window can be dynamically changed based on a half full or overflow status (i.e., the half full signal or the overflow signal being output from the scratchpad module 40).

Figure 4:
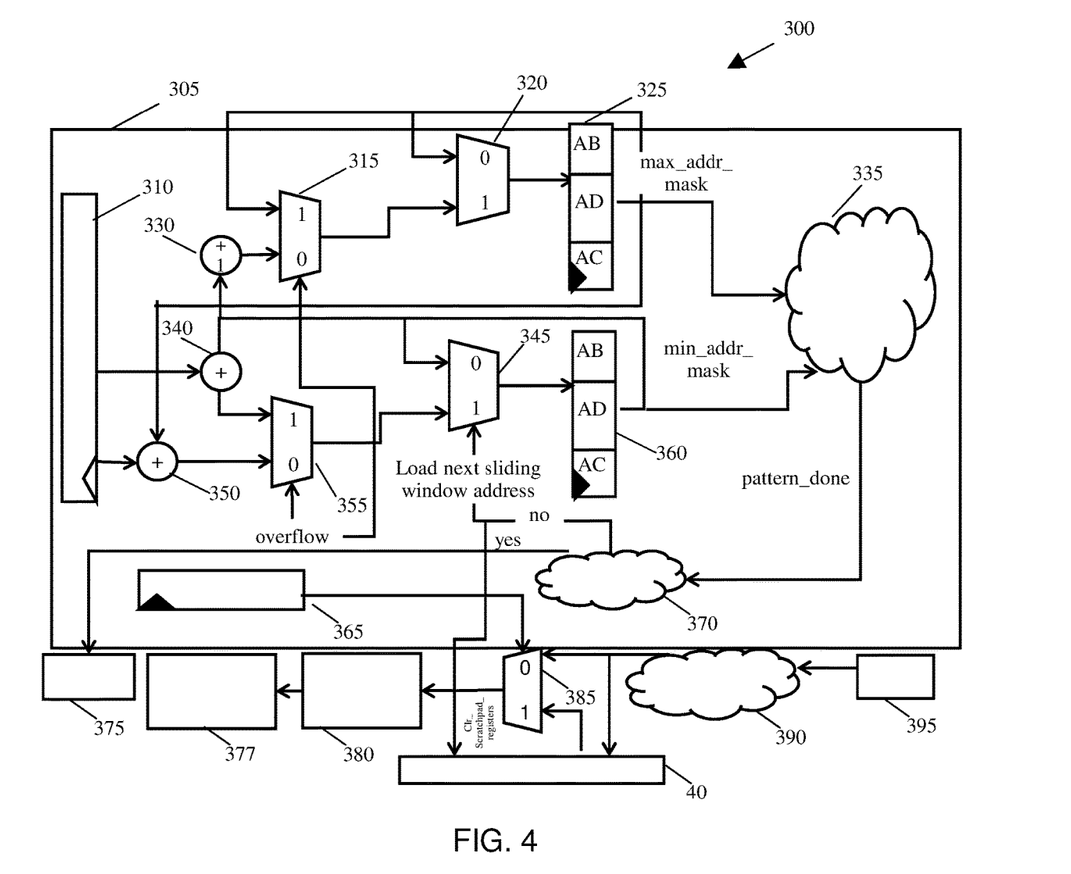
FIG. 4 shows a MBIST max address control structure in accordance with aspects of the present disclosure.

FIG. 4 shows a MBIST max address control structure in accordance with aspects of the present disclosure. In embodiments, a MBIST max address control structure 300 of the BIST engine 15 includes a control register 305. The control register 305 can program a sliding window range and control the maximum address masking register 325 and the minimum address masking register 360. The control register 305 can increment the maximum address masking register 325 for each set of pattern runs until the maximum bank address is reached for the low voltage corner mode.

The control register 305 includes a final sliding window count 310 (which can be similar or a same structure as the final sliding window count 230 in FIG. 2), multiplexers 315, 320, 345, and 355, a maximum address masking register 325, an incrementor 330, a generation structure 335, adder circuits 340, 350, a minimum address masking register 360, an enable ECC BIST structure 365, and an address check structure 370. In the MBIST max address control structure 300 and outside the control register 305, a BIST done structure 375, a memory 377, a repair module 380, a multiplexer 385, a scratchpad module 40, an incoming fail row and column address structure 390, and a built-in self test input output (BIO) 395 are shown.

In the operation of the structure shown in FIG. 4, the output of the final sliding window count 310 (which can be similar or a same structure as the final sliding window count 230 in FIG. 2) is sent to the adder circuits 340, 350. The adder circuit 340 adds the output of the final sliding window count 310 and a minimum address mask min_addr_mask and outputs the additive result to the multiplexer 355. The adder circuit 350 adds the output of the final sliding window count 310 and a maximum address mask max_addr_mask and outputs the additive result to the multiplexer 355. Therefore, the adder circuits 340, 350 are used to calculate a next sliding window minimum and maximum address using the sliding window range. The MBIST is then run on the next sliding window minimum and maximum addresses for all patterns. The multiplexer 355 will output one of these inputs based on a value of the overflow signal.

In further operation, the multiplexer 345 takes an input from the minimum address mask min_addr_mask and an input from the output of the multiplexer 355. The multiplexer 355 will output one of these inputs based on a next sliding window address being loaded. The output of the multiplexer 345 will be sent to the minimum address masking register 360. The incrementor 330 will increment the minimum address mask min_addr_mask and output the result to the multiplexer 315. The multiplexer 315 will also take an input from the maximum address mask max_addr_mask. Further, the multiplexer 315 will output one of these inputs to the multiplexer 320. The multiplexer 320 will also receive the maximum address mask max_addr_mask as an input and output one of these inputs to the maximum address masking register 325.

Still referring to the operation of the structure shown in FIG. 4, the generation structure 335, which is a logic gate, will receive the maximum address mask max_addr_mask and the minimum address mask min_addr_mask and generated address, control, and data signals for all of the patterns of a word bank. Then, the generation structure 335 will output a pattern_done signal which will be sent to the address check structure 370 by continuing the sliding window movement to run MIBST patterns across the memory until all addresses of the memory have been covered. The address check structure 370 will check whether all addresses have been covered (i.e., all addresses in a sliding window have been run).

If all the addresses have been covered (i.e., all addresses have been covered=YES), then the BIST done structure 375 will indicate that the built-in self test has been completed for all patterns in the sliding window. If all the addresses have not been covered (i.e., all addresses have been covered=NO), then the next sliding window address will be loaded and a signal will be sent to the multiplexer 345 indicating that the next sliding window address will be loaded. Further, if all the addresses have not been covered, a signal is sent to the scratchpad module 40 by the address check structure 370 to clear the scratchpad registers. In the control register 305, the enable ECC BIST structure 365 will send a signal to the multiplexer 385 when an error correcting coding (ECC) is performed in the BIST engine 15.

The built-in self test input output (BIO) 395 outputs an incoming fail row and column address to the incoming fail row and column address structure 390. The incoming fail row and column address structure 390 will then send the incoming fail row and column address to the scratchpad module 40 and the multiplexer 385. The multiplexer 385 will output one of the inputs from the incoming fail row and column address structure 390 and the scratchpad module 40 based on the signal from the enable ECC BIST structure 365. For example, if the incoming fail row and column address is a multi-cell failure in a single wordline, the multiplexer 385 will send the incoming fail row and column address to the repair module 380. The repair module 380 will repair the multi-cell failure in the single wordline using available redundancies (i.e., redundant rows and columns) and send the repaired rows and columns to the memory 377. If the incoming fail row and column address is not a multi-cell failure in a single wordline (i.e., merely a single cell failure), then the incoming fail row and column address will be repaired using error correcting coding (ECC).

Figure 5:
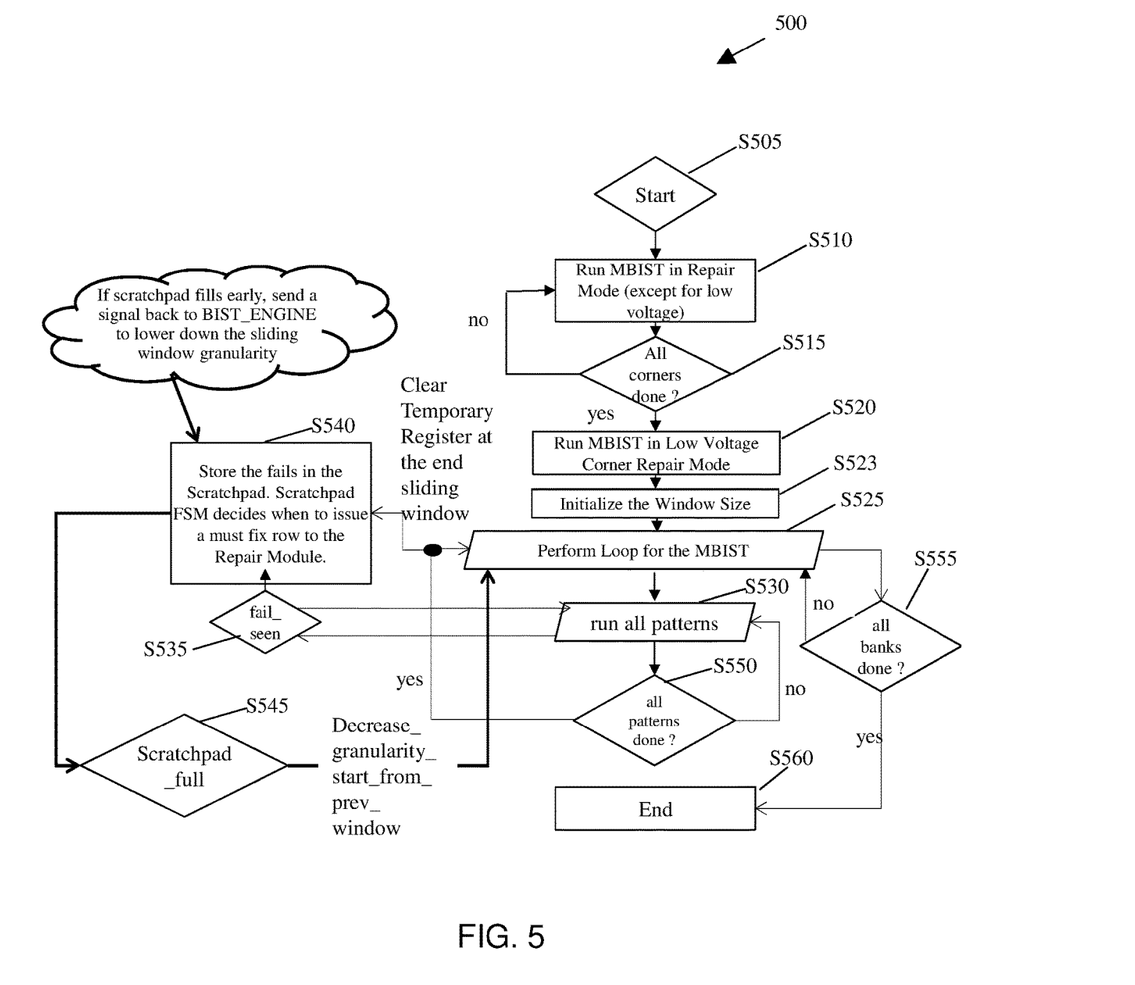
FIG. 5 shows a flowchart of the MBIST structure with the scratchpad structure in accordance with aspects of the present disclosure.

FIG. 5 shows a flowchart of the MBIST structure with the scratchpad structure in accordance with aspects of the present disclosure. The flowchart 500 starts at step S505. In step S510, the MBIST is run in repair mode, with the exception of a low voltage mode. In step S515, a determination is made whether all corners are run in repair mode, with the exception of a low voltage mode for the corners. If all corners have not been done (i.e., all corners run in repair mode=NO), the process returns to step S510. If all corners have been completed (i.e., all corners run in repair mode=YES), then the process proceeds to step S520.

In step S520, the MBIST is run in low voltage corner repair mode for a part of memory which is defined by a size of the sliding window. In step S23, the sliding window size in initialized. In particular, the sliding window size is initialized by setting a current_window_min=0 and current_window_max=window_size. In step S525, a loop is performed for the MBIST. In particular, for (current_window_min=; current window_max<max_addr), the current_window_min=current_window_min+window_size (i.e., granularity) & the current_window_max=current_window_max+window_size (i.e., granularity). In Step S530, all patterns are run in the loop for a sliding window (e.g., memory bank). Further, in Step S555, if it is determined that all sliding windows (e.g., memory banks) are completed (i.e., all memory banks done=YES), then the process ends at Step S560. Otherwise, in Step S555, if it is determined that all sliding windows (e.g., memory banks) are not completed (i.e., all memory banks done=NO), the flowchart process back to Step S525.

In Step S550, it is determined whether all patterns are completed. If all patterns are not completed (i.e., all patterns being done=NO), then the flowchart loops back to S530. In Step S535, if a failure has been seen when the patterns are run in Step S530, the failure (and all of the remaining failures) are stored in the scratchpad in Step S540.

In step S540, the scratchpad finite state machine (FSM) determines when to issue a must fix row to the repair module. The scratchpad FSM will determine that the must fix row should be issued to the repair module when there is a multi-cell failure in a single wordline. In other words, the scratchpad FSM, which is a logic circuit, marks a redundant row as bad in a low voltage state only if a number of individual fails are more than the fails that can be fixed by the ECC. Please note that all temporary register will be cleared at the end of the sliding window. If the scratchpad FSM determines that there is only a single cell failure in a single wordline, the repair module does not implement any fix and the single cell failure can be fixed during an error correction coding (ECC).

In the flowchart 500 of FIG. 5, if the scratchpad registers of the scratchpad are filled, a signal will be sent to the BIST engine to lower down the sliding window granularity. In particular, if the scratchpad is determined to be in a full state at Step S545, the granularity is decreased (for example, the sliding window size may be cut in half). Then, the patterns are started from the previous window in Step S525 and run again in Step S530.

The circuit and the method for a MBIST ECC of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a MBIST ECC of the present disclosure has been adopted from integrated circuit (IC) technology. For example, the structures are built on wafers and are realized in films of material patterned by photolithographic processes on the top of a wafer. In particular, the fabrication of the circuit and the method for a MBIST ECC uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Further, the circuit and the method for logic-in-memory computations of the present disclosure can have wide applicability in high throughput processors for machine learning and artificial intelligence.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A memory built-in self test (MBIST) circuit which is configured to repair a multi-cell failure for a plurality of patterns in a single wordline of a sliding window of a memory, the MBIST circuit comprising:
   a scratchpad module configured to store failures for the plurality of patterns of the sliding window,
   wherein the scratchpad module is configured to compare a row of an incoming cell failure of the plurality of patterns of the sliding window with a row of previously stored failures to (i) determine whether the incoming failure is a single cell failure for the single wordline and (ii) determine whether the incoming failure is a multi-cell failure for the single wordline; and
   a repair module configured to selectively repair both the single cell failure and the multi-cell failure, wherein the repair module is configured to (i) in response to the scratchpad module determining that the incoming cell failure is the multi-cell failure, repair the multi-cell failure and (ii) in response to the scratchpad module determining that the incoming cell failure is the single cell failure, leave the single cell failure unrepaired,
   wherein the MBIST circuit is configured to complete repair of multi-cell failures in the memory and clear the scratchpad module to leave any single cell failures in the memory unrepaired.

2. The MBIST circuit of claim 1, wherein the MBIST circuit is further configured to allow the single cell failure to be repaired by an error correcting code (ECC) subsequent to completing repair of all multi-cell failures in the memory.

3. The MBIST circuit of claim 1, wherein the MBIST circuit is configured to store the failures for the plurality of patterns of the sliding window in a plurality of scratchpad registers.

4. The MBIST circuit of claim 1, wherein the MBIST circuit further comprises an ECC device which is configured to selectively repair the single cell failure subsequent to completing repair of all multi-cell failures in the memory.

5. The MBIST circuit of claim 3, wherein the scratchpad module is configured to determine whether each of the plurality of scratchpad registers is full and sends an overflow signal in response to a determination that each of the scratchpad registers is full.

6. The MBIST circuit of claim 5, wherein the MBIST circuit further comprises a built in self test (BIST) engine which is configured to receive the overflow signal and dynamically reduce a size of the sliding window of the memory for the plurality of patterns, wherein the sliding window corresponds to a portion of the memory and the size of the sliding window corresponds to a size of the portion of the memory.

7. The MBIST circuit of claim 6, wherein the BIST engine is further configured to dynamically halve the size of the sliding window in response to receiving the overflow signal.

8. A circuit comprising:
   a memory;
   a built-in self test input-output interface (BIO);
   a built-in self test (BIST) engine which is configured to interface with the BIO to run a plurality of patterns in a sliding window of the memory for a low voltage corner repair mode;
   a scratchpad module which is configured to store failures for the plurality of patterns of the sliding window in a plurality of scratchpad registers,
   wherein the scratchpad module is further configured to compare a row of an incoming cell failure with a row of previously stored failures in the plurality of scratchpad registers to (i) determine whether the incoming failure is a single cell failure for a single wordline and (ii) determine whether the incoming failure is a multi-cell failure for the single wordline; and
   a repair module configured to selectively repair both the single cell failure and the multi-cell failure, wherein the repair module is configured to (i) in response to the scratchpad module determining that the incoming cell failure is the multi-cell failure, repair the multi-cell failure and (ii) in response to the scratchpad module determining that the incoming cell failure is the single cell failure, leave the single cell failure unrepaired,
   wherein the BIST engine is configured to complete repair of multi-cell failures in the memory and clear the plurality of scratchpad registers to leave any single cell failures in the memory unrepaired.

9. The circuit of claim 8, further comprises an ECC device which is configured to repair the single cell failure subsequent to completing repair of all multi-cell failures in the memory.

10. The circuit of claim 8, wherein the scratchpad module is further configured to determine whether each of the plurality of scratchpad registers is full and sends an overflow signal in response to a determination that each of the scratchpad registers is full.

11. The circuit of claim 10, wherein the BIST engine is further configured to receive the overflow signal from the scratchpad module and dynamically reduce a size of the sliding window of the memory for the plurality of patterns, wherein the sliding window corresponds to a portion of the memory and the size of the sliding window corresponds to a size of the portion of the memory.

12. The circuit of claim 11, wherein the BIST engine is further configured to dynamically halve the size of the sliding window in response to receiving the overflow signal.

13. The circuit of claim 8, wherein the scratchpad module is further configured to determine whether fewer than half of the plurality of scratchpad registers are full and sends a less than half full signal in response to a determination that the scratchpad registers are less than half full.

14. The circuit of claim 13, wherein the BIST engine is further configured to dynamically double the size of the sliding window in response to receiving the less than half full signal.

15. A method of operating a circuit configured to repair both single cell failures and multi-cell failures of a memory, the method comprising:
   programming a sliding window for the memory, wherein the sliding window corresponds to a portion of the memory and a size of the sliding window corresponds to a size of the portion of the memory;

running a memory built-in self test (MBIST) for a plurality of patterns in the sliding window for the memory during a low voltage corner repair mode;

storing all cell failures for the plurality of patterns in the sliding window for the memory in a plurality of scratchpad registers;

comparing a row of the incoming cell failure with a row of previously stored failures in the plurality of scratchpad registers determining whether an incoming cell failure of the cell failures is a single cell failure for a single wordline and determining whether the incoming cell failure is a multi-cell failure for the single wordline;

repairing the multi-cell failure by using redundant rows and columns in response to determining that the incoming cell failure is the multi-cell failure;

in response to determining that the incoming cell failure is the single cell failure, leaving the single cell failure unrepaired;

dynamically reducing the size of the sliding window in response to each of the plurality of scratchpad registers being full; and completing repair of multi-cell failures in the memory and clearing the plurality of scratchpad registers to leave any single cell failures in the memory unrepaired.

16. The method of claim 15, further comprising selectively repairing the single cell failure using an error correcting coding subsequent to completing repair of all multi-cell failures in the memory.

* * * * *